(12) United States Patent
Asahara et al.

(10) Patent No.: US 11,171,216 B2
(45) Date of Patent: Nov. 9, 2021

(54) SEMICONDUCTOR DEVICE AND CONTROL SYSTEM

(71) Applicants: Kabushiki Kaisha Toshiba, Minato-ku (JP); Toshiba Electronic Devices & Storage Corporation, Minato-ku (JP)

(72) Inventors: Hidetoshi Asahara, Ibo (JP); Akihiro Tanaka, Himeji (JP); Toru Shono, Himeji (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 42 days.

(21) Appl. No.: 15/911,248

(22) Filed: Mar. 5, 2018

(65) Prior Publication Data

US 2019/0088749 A1 Mar. 21, 2019

(30) Foreign Application Priority Data

Sep. 19, 2017 (JP) .............................. JP2017-179414

(51) Int. Cl.
*H01L 29/40* (2006.01)
*H01L 29/78* (2006.01)
*H01L 23/532* (2006.01)
*H02J 7/00* (2006.01)

(52) U.S. Cl.
CPC ...... *H01L 29/407* (2013.01); *H01L 23/53271* (2013.01); *H01L 29/7813* (2013.01); *H02J 7/0029* (2013.01); *H02J 7/0031* (2013.01); *H02J 7/0047* (2013.01); *H01L 23/53209* (2013.01); *H01L 23/53214* (2013.01); *H01L 23/53228* (2013.01); *H01L 23/53242* (2013.01); *H01L 23/53257* (2013.01); *H02J 7/00304* (2020.01)

(58) Field of Classification Search
None
See application file for complete search history.

(56) References Cited

U.S. PATENT DOCUMENTS

| | | | |
|---|---|---|---|
| 6,472,709 B1 | 10/2002 | Blanchard | |
| 6,740,931 B2 | 5/2004 | Kouzuki et al. | |
| 2002/0125527 A1* | 9/2002 | Blanchard | H01L 29/0878 257/328 |
| 2006/0118866 A1* | 6/2006 | Yanagida | H01L 27/0266 257/343 |
| 2016/0104767 A1* | 4/2016 | Yamashita | H01L 29/41708 257/342 |
| 2017/0221885 A1* | 8/2017 | Sander | H01L 29/78 |

(Continued)

FOREIGN PATENT DOCUMENTS

| | | |
|---|---|---|
| JP | 8-32060 A | 2/1996 |
| JP | 2003-309261 | 10/2003 |
| JP | 2005-525703 | 8/2005 |

(Continued)

*Primary Examiner* — Steven M Christopher
(74) *Attorney, Agent, or Firm* — Oblon, McClelland, Maier & Neustadt, L.L.P.

(57) ABSTRACT

According to an embodiment, a semiconductor device includes a first semiconductor layer, a first switching element, a second switching element, and a conductor. The conductor is provided at least in part on the first semiconductor layer and located between the first switching element and the second switching element in a first direction.

15 Claims, 2 Drawing Sheets

(56) References Cited

U.S. PATENT DOCUMENTS

2017/0287802 A1* 10/2017 Numabe ............. H01L 27/0629
2019/0386131 A1* 12/2019 Takeuchi ............ H01L 21/0495

FOREIGN PATENT DOCUMENTS

| JP | 2006-147700 | 6/2006 |
| JP | 2008-205500 | 9/2008 |
| JP | 2009-88006 A | 4/2009 |

* cited by examiner

SEMICONDUCTOR DEVICE AND CONTROL SYSTEM

CROSS-REFERENCE TO RELATED APPLICATIONS

This application is based upon and claims the benefit of priority from Japanese Patent Application No. 2017-179414, filed on Sep. 19, 2017; the entire contents of which are incorporated herein by reference.

FIELD

Embodiments of the invention relate generally to a semiconductor device and a control system.

BACKGROUND

MOSFET (metal oxide semiconductor field effect transistor) is a semiconductor device operable for switching the direction of the current path. A plurality of such MOSFETs are integrated with a common electrode in a chip and incorporated in a circuit such as a protection circuit. Integrating a plurality of MOSFETs causes concern about high resistance value due to the current path lengthened in the chip.

DETAILED DESCRIPTION

Figure 1:
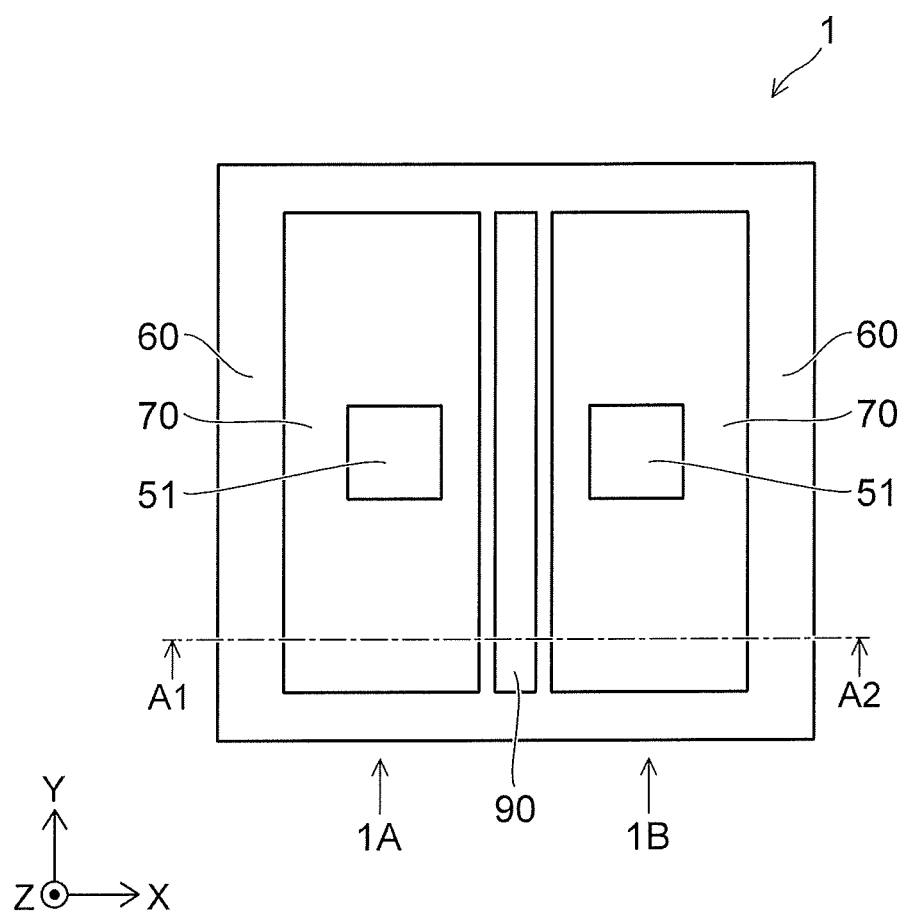
FIG. 1 is a plan view showing a semiconductor device according to an embodiment.

According to an embodiment, a semiconductor device includes a first semiconductor layer, a first switching element, a second switching element, and a conductor. A conductivity type of the first semiconductor layer is a first conductivity type. The first switching element includes a plurality of first element parts and a first electrode, the first element parts being provided on the first semiconductor layer, each of the first element parts including a first control electrode, the first electrode being provided on the first element parts. The second switching element includes a plurality of second element parts and a second electrode, the second element parts being provided on the first semiconductor layer, each of the second element parts including a second control electrode, the second electrode being provided on the second element parts. The second switching element is juxtaposed in a first direction with the first switching element. The conductor is provided at least in part on the first semiconductor layer and located between the first switching element and the second switching element in the first direction.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

Embodiment

FIG. 1 is a plan view showing a semiconductor device according to this embodiment.

Figure 2:
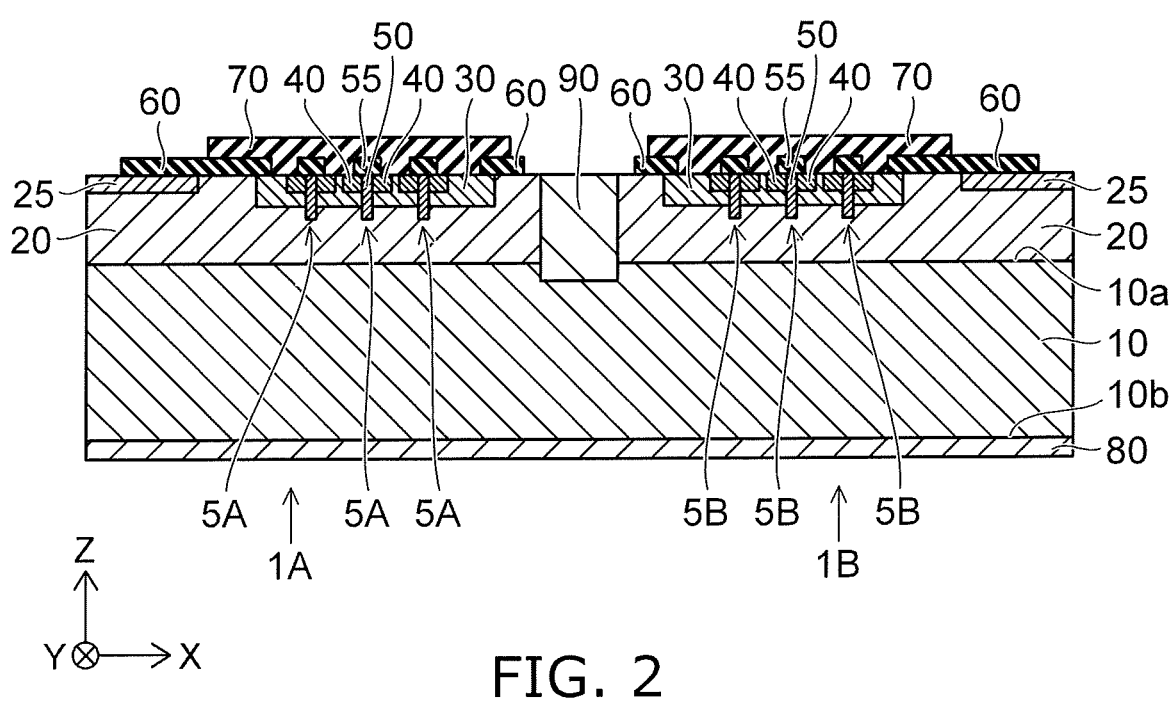
FIG. 2 is a sectional view showing the semiconductor device according to the embodiment.

FIG. 2 is a sectional view taken along line A1-A2 of FIG. 1.

An XYZ orthogonal coordinate system is adopted in this specification. The direction from the drain electrode 80 to the semiconductor layer 10 is referred to as Z-direction. Two directions perpendicular to the Z-direction and orthogonal to each other are referred to as X-direction and Y-direction.

As shown in FIGS. 1 and 2, the semiconductor device 1 is provided with a switching element 1A and a switching element 1B. The switching element 1A and the switching element 1B are e.g. MOSFETs. The switching element 1A and the switching element 1B are juxtaposed in the X-direction. For instance, the switching element 1A and the switching element 1B are integrated in one chip.

In the example shown in FIG. 1, the semiconductor device 1 is composed of two switching elements 1A, 1B. However, the semiconductor device 1 may be composed of three or more switching elements. For instance, the same components are provided in the switching element 1A and the switching element 1B.

The components in the switching elements 1A, 1B are described below.

The switching elements 1A, 1B are each provided with a semiconductor layer 10 of a first conductivity type, a semiconductor layer 20 of the first conductivity type, a semiconductor layer 25 of the first conductivity type, a semiconductor layer 30 of a second conductivity type, a semiconductor layer 40 of the first conductivity type, a gate electrode 50, a gate contact 51, an insulating layer 55, an insulating layer 60, a source electrode 70, and a drain electrode 80. The following describes the case where the first conductivity type is n-type and the second conductivity type is p-type. The semiconductor layer 10 includes a semiconductor substrate. The semiconductor layer 10 has a first surface 10a and a second surface 10b. The second surface 10b is a surface on the opposite side from the first surface 10a. For instance, the semiconductor layer 10 contains silicon (Si), and its conductivity type is $n^+$-type.

The notations of $n^+$, $n$, $n^-$, and $p^+$, $p$, $p^-$ represent relative magnitude of effective impurity concentration in the respective conductivity types. More specifically, the notation marked with "+" represents relatively higher impurity concentration than the notation not marked with "+" or "−". The notation marked with "−" represents relatively lower impurity concentration than the notation not marked with any of the signs.

The "effective impurity concentration" refers to the concentration of impurity contributing to the conductivity of a semiconductor material. For instance, in the case where the semiconductor material contains both an impurity serving as a donor and an impurity serving as an acceptor, the effective impurity concentration is defined as the concentration except the amounts canceling out each other. The n-type impurity is e.g. phosphorus (P). The p-type impurity is e.g. boron (B).

The semiconductor layer 20 is provided on the semiconductor layer 10. The semiconductor layer 20 is located on the first surface 10a of the semiconductor layer 10. For instance, the semiconductor layer 20 contains silicon, and its conductivity type is n⁻-type. For instance, the semiconductor layer 20 is a drift region.

The semiconductor layer 25 is provided on the semiconductor layer 20. For instance, the semiconductor layer 25 contains silicon, and its conductivity type is n⁺-type. For instance, the conductivity type of the semiconductor layer 25 is n-type. For instance, the semiconductor layer 25 functions as a channel stopper.

The semiconductor layer 30 is provided on the semiconductor layer 20. For instance, the semiconductor layer 30 contains silicon, and its conductivity type is p-type. For instance, the semiconductor layer 30 is a base region.

The semiconductor layer 40 is provided in a plurality on the semiconductor layer 30. The plurality of semiconductor layers 40 are located selectively on the semiconductor layer 30. The plurality of semiconductor layers 40 are spaced from each other in the X-direction. For instance, the semiconductor layer 40 contains silicon, and its conductivity type is n-type.

The gate electrode 50 is provided in a plurality on the semiconductor layer 20, the semiconductor layer 30, and the semiconductor layer 40. The plurality of gate electrodes 50 are spaced from each other in the X-direction. Part of the gate electrode 50 is located in a trench provided in the semiconductor layers 20, 30, 40. The semiconductor layer 40 is located on both X-direction sides of the gate electrode 50 in the trench.

The gate electrode 50 contains e.g. a metal material. The gate electrode 50 contains at least one of the metals such as nickel (Ni), aluminum (Al), titanium (Ti), tungsten (W), molybdenum (Mo), copper (Cu), gold (Au), and platinum (Pt). The gate electrode 50 may be configured without containing a metal material. For instance, the gate electrode 50 is formed from polycrystalline silicon containing impurity.

For instance, an insulating film (not shown) such as a gate insulating film is provided around the gate electrode 50. The gate electrode 50 is placed on the semiconductor layers 20, 30, 40 via the gate insulating film.

The gate contact 51 is formed from a metal material and connected to a plurality of gate electrodes 50. The plurality of gate electrodes 50 are electrically connected to a peripheral circuit (not shown) such as a control circuit through the gate contact 51. As shown in FIG. 1, the gate contact 51 is provided near the center of the switching element 1A, 1B. However, the formation position and number of gate contacts 51 are arbitrary. For instance, there is an opening in the central part of the source electrode 70, and the gate contact 51 is placed in the opening and connected to each gate electrode 50.

The insulating layer 55 is provided on the semiconductor layer 40 and the gate electrode 50. For instance, the insulating layer 55 contains silicon oxide (SiO). The source electrode 70 is placed on each gate electrode 50 via the insulating layer 55. That is, the insulating layer 55 electrically insulates the gate electrode 50 from the source electrode 70.

The insulating layer 60 is provided on the semiconductor layers 20, 25, 30. For instance, the insulating layer 60 contains silicon oxide.

The source electrode 70 is provided on the semiconductor layer 30, the semiconductor layer 40, the insulating layer 55, and the insulating layer 60. The source electrode 70 contains e.g. a metal material. The source electrode 70 contains at least one of the metals such as nickel, aluminum, titanium, tungsten, molybdenum, copper, gold, and platinum.

The drain electrode 80 is provided on the second surface 10b of the semiconductor layer 10. The drain electrode 80 contains e.g. a metal material. For instance, the drain electrode 80 contains at least one of the metals such as nickel, aluminum, titanium, tungsten, molybdenum, copper, gold, platinum, and silver (Ag).

As shown in FIG. 2, the switching element 1A is provided with a plurality of element parts 5A. The switching element 1B is provided with a plurality of element parts 5B. The element parts 5A, 5B are placed along e.g. the X-direction and the Y-direction. The element parts 5A, 5B are e.g. MOS transistors.

In the semiconductor device 1 of this embodiment, MOSFETs are placed in the X-direction. Each MOSFET includes a plurality of MOS transistors placed along the X-direction and the Y-direction.

The element part 5A of the switching element 1A includes as electrodes a gate electrode 50, a source electrode 70, and a drain electrode 80. The element part 5B of the switching element 1B includes as electrodes a gate electrode 50, a source electrode 70, and a drain electrode 80. The drain electrode 80 is common in the plurality of element parts 5A, 5B.

The source electrode 70 of the element part 5A and the source electrode 70 of the element part 5B are applied with different potentials. On/off is switched by a control signal applied to the gate electrode 50 of the element part 5A through the gate contact 51. On/off is switched by a control signal applied to the gate electrode 50 of the element part 5B through the gate contact 51. When the element parts 5A, 5B are simultaneously turned on by the control signals, a current flows in the semiconductor device 1 by the potential difference between the source electrode 70 of the element part 5A and the source electrode 70 of the element part 5B. That is, the current flows between the switching element 1A and the switching element 1B. In this case, for instance, the drain electrode 80 is insulated and placed in the floating state. Thus, the current flows horizontally (in the X-direction in the example of FIG. 2) between the switching element 1A and the switching element 1B.

When the source electrode 70 of the element part 5A is placed at a higher potential than the source electrode 70 of the element part 5B, the current flows from the switching element 1A to the switching element 1B. When the source electrode 70 of the element part 5A is placed at a lower potential than the source electrode 70 of the element part 5B, the current flows from the switching element 1B to the switching element 1A.

Next, the components between the switching element 1A and the switching element 1B are described.

As shown in FIGS. 1 and 2, the semiconductor device 1 is further provided with a conductor 90.

The conductor 90 is provided on the semiconductor layer 10. The conductor 90 is located between the switching element 1A and the switching element 1B in the X-direction and extends in the Y-direction.

The conductor 90 has a prescribed thickness in the Z-direction from the surface of the semiconductor layer 20 on the opposite side from the surface facing the semiconductor layer 10. For instance, the conductor 90 penetrates through the semiconductor layer 20 to the semiconductor layer 10 in the Z-direction. That is, the semiconductor layers 10, 20 are located on both X-direction side surfaces of the conductor 90. The bottom surface of the conductor 90 reaches the semiconductor layer 10.

In the example of FIG. 2, the conductor 90 penetrates through the semiconductor layer 20 to the semiconductor layer 10 in the Z-direction. However, the conductor 90 may not penetrate through the semiconductor layer 20. That is, the conductor 90 may be provided so as to form a depression in the semiconductor layer 20. In this case, the conductor 90 is located on the semiconductor layer 20. The semiconductor layer 20 is located on both X-direction side surfaces of the conductor 90. The bottom surface of the conductor 90 reaches the semiconductor layer 20.

The conductor 90 may penetrate through the semiconductor layer 10 and the semiconductor layer 20 in the Z-direction to the drain electrode 80. In this case, the conductor 90 is located on the drain electrode 80. The semiconductor layers 10, 20 are located on both X-direction side surfaces of the conductor 90. The bottom surface of the conductor 90 reaches the drain electrode 80.

The conductor 90 contains e.g. a metal material such as tungsten. The conductor 90 may contain a metal material such as nickel, aluminum, titanium, molybdenum, copper, gold, and platinum. The conductor 90 may contain metal silicide containing e.g. titanium. In the case where the conductor 90 contains a metal material, the conductor 90 is formed by forming a trench in the semiconductor layer 20 between the switching element 1A and the switching element 1B and then burying the metal material in the trench.

The conductor 90 may contain e.g. silicon. In the case where the conductor 90 contains silicon, the conductor 90 is formed by e.g. ion-implanting n-type impurity from the surface of the semiconductor layer 20 on the opposite side from the surface facing the semiconductor layer 10. In the case where the conductivity type of the semiconductor layer 20 is $n^-$-type, the conductor 90 is formed from the semiconductor layer 20 by ion implantation increasing its impurity concentration to turn its conductivity type to n-type or $n^+$-type. The conductor 90 may contain polysilicon.

Next, an example of the connection configuration of the semiconductor device 1 is described.

Figure 3:
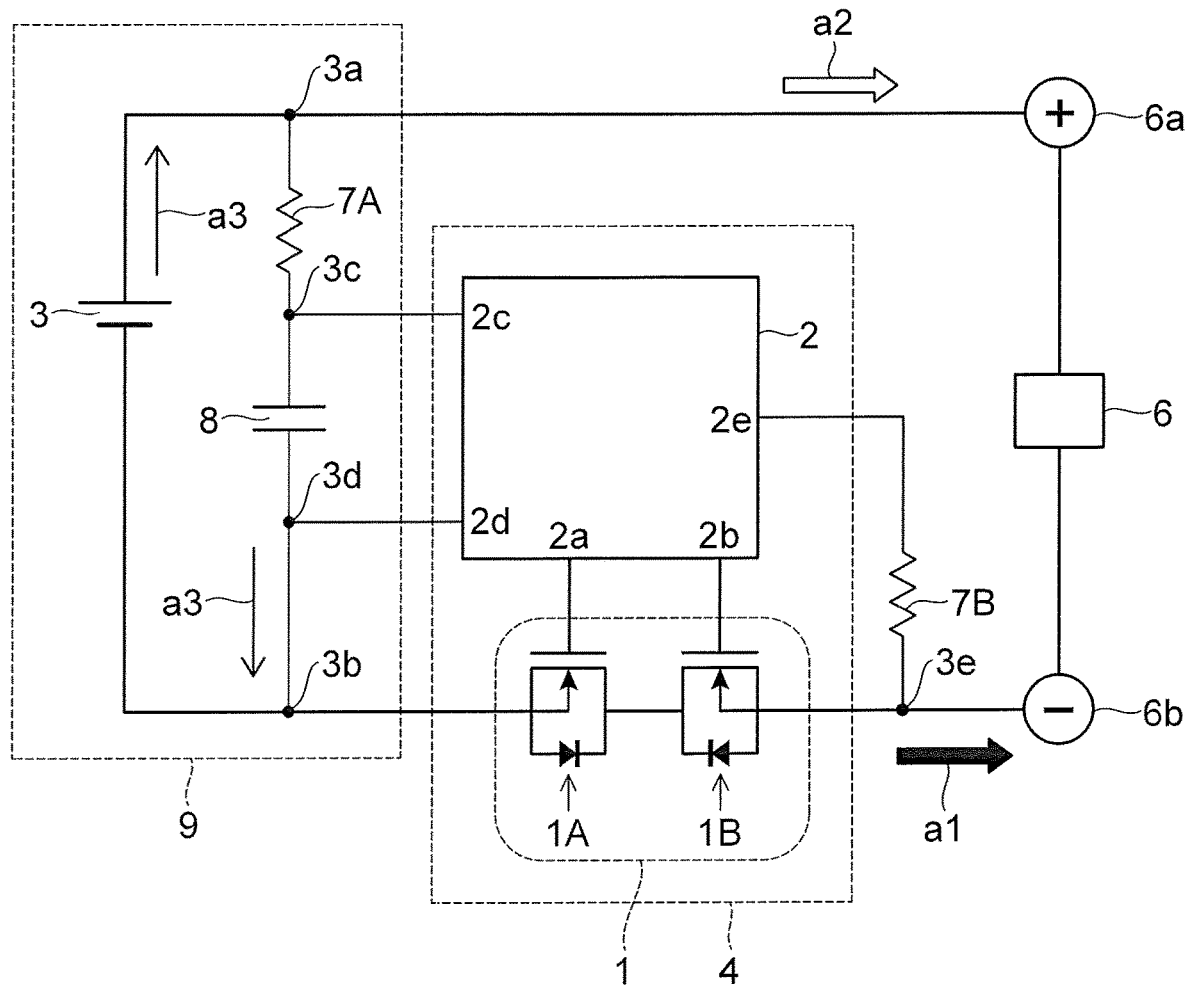
FIG. 3 is a circuit diagram showing the connection configuration of the semiconductor device according to the embodiment.

FIG. 3 is a circuit diagram showing the connection configuration of the semiconductor device according to this embodiment. In FIG. 3, a protection circuit for a rechargeable battery is shown as an example of the connection configuration of the semiconductor device.

As shown in FIG. 3, the protection circuit 4 includes a semiconductor device 1 and a control circuit 2. The protection circuit 4 is connected in series with a rechargeable battery 3. The semiconductor device 1 includes switching elements 1A, 1B as MOSFETs. The switching element 1A and the switching element 1B each include a parasitic diode and are connected to each other.

The rechargeable battery 3 and the protection circuit 4 are connected to a power supply 6 such as a charger through a positive terminal 6a and a negative terminal 6b. A terminal 3a is provided between the positive terminal 6a and the rechargeable battery 3. A terminal 3b is provided between the negative terminal 6b and the rechargeable battery 3 (between the protection circuit 4 and the rechargeable battery 3).

A load 7A and a capacitor 8 are provided between the protection circuit 4 and the rechargeable battery 3. A terminal 3c is provided between the load 7A and the control circuit 2. A terminal 3d is provided between the capacitor 8 and the control circuit 2. One end of the load 7A is connected to the terminal 3a. The other end of the load 7A is connected to the terminal 3c. One end of the capacitor 8 is connected to the terminal 3c. The other end of the capacitor 8 is connected to the terminal 3d.

The rechargeable battery 3, the load 7A, and the capacitor 8 are connected in series through the terminals 3a, 3b, 3c, 3d to constitute a circuit 9.

A load 7B is provided between the protection circuit 4 and the power supply 6. A terminal 3e is provided between the load 7B and the negative terminal 6b. One end of the load 7B is connected to the terminal 3e. In the example shown in FIG. 3, the protection circuit 4 (the semiconductor device 1 and the control circuit 2), the power supply 6, the loads 7A, 7B, and the capacitor 8 constitute a system for controlling charging and discharging of the rechargeable battery 3.

The control circuit 2 is provided with a control terminal 2a and a control terminal 2b connected to the gate electrodes 50 of the switching element 1A and the switching element 1B, respectively. A control signal is applied from the control circuit 2 to the gate electrodes 50 of the switching element 1A and the switching element 1B through the control terminal 2a and the control terminal 2b, respectively. The source electrode 70 of the switching element 1A is located on the positive terminal 6a side and connected to the power supply 6 through the rechargeable battery 3. The source electrode 70 of the switching element 1B is located on the negative terminal 6b side and connected to the power supply 6. Thus, in the semiconductor device 1, the current flows in both directions between the switching element 1A and the switching element 1B.

The control circuit 2 is provided with input terminals 2c, 2d, 2e. For instance, the control circuit 2 detects the power supply voltage of the control circuit 2 and the voltage of the rechargeable battery 3 through the input terminals 2c, 2d. For instance, the control circuit 2 detects the potential between the input terminal 2d and the negative terminal 6b through the input terminal 2e.

Next, the charging and discharging operation of the rechargeable battery 3 is described.

The control circuit 2 detects the voltage of the rechargeable battery 3 through the input terminal 2c. In the case of the normal state, the control circuit 2 switches on the switching element 1A and the switching element 1B. In the case of the charging operation of the rechargeable battery 3, the control circuit 2 switches on the switching element 1A and the switching element 1B. Thus, the current flows in the direction of arrow a1, i.e. the charging direction of the rechargeable battery 3. In this case, the current flows from the switching element 1A to the switching element 1B.

On the other hand, in the case of the discharging operation of the rechargeable battery 3, the control circuit 2 switches on the switching element 1A and the switching element 1B. Thus, the current flows in the direction of arrow a2, i.e. the discharging direction of the rechargeable battery 3. In this case, the current flows from the switching element 1B to the switching element 1A. Because the protection circuit 4 and the rechargeable battery 3 are connected to each other, discharging cannot be stopped completely. Thus, at the time of discharging, a current may flow in the direction of arrow a3 in the circuit 9.

In the normal state, the voltage of the rechargeable battery 3 falls within the range of prescribed voltage values. Thus, the switching element 1A and the switching element 1B are both turned on.

Next, the protecting operation for overcharge and overdischarge is described.

First, the protecting operation of the control circuit 2 through the input terminal 2c is described.

The control circuit 2 detects the voltage of the rechargeable battery 3 through the input terminal 2c. In the case of the overcharge state, the control circuit 2 stops the current flowing to the control terminal 2b (for instance, outputs a signal for turning off the switching element 1B). Thus, the switching element 1B is turned off, and no current flows from the switching element 1A to the switching element 1B. That is, no current flows through the switching element 1B. Accordingly, the current flowing in the semiconductor device 1 depends on the resistance and parasitic diode (reverse direction) of the switching element 1A. Discharging can be performed from the overcharge state because the parasitic diode is in the forward direction.

In the overcharge state, the voltage of the rechargeable battery 3 is higher than a prescribed voltage value. Thus, the switching element 1A and the switching element 1B are turned on and off, respectively. This stops charging, and the current flows in the direction of arrow a2 by discharging of the rechargeable battery 3 through the parasitic diode of the switching element 1B and the switching element 1A in the on-state.

The control circuit 2 detects the voltage of the rechargeable battery 3 through the input terminal 2c. In the case of the overdischarge state, the control circuit 2 stops the current flowing to the control terminal 2a (for instance, outputs a signal for turning off the switching element 1A). Thus, the switching element 1A is turned off, and no current flows from the switching element 1B to the switching element 1A. That is, no current flows through the switching element 1A. Accordingly, the current flowing in the semiconductor device 1 depends on the resistance and parasitic diode (reverse direction) of the switching element 1B. Charging can be performed from the overdischarge state because the parasitic diode is in the forward direction.

In the overdischarge state, the voltage of the rechargeable battery 3 is lower than a prescribed voltage value. Thus, the switching element 1A and the switching element 1B are turned off and on, respectively. This stops discharging, and the current flows in the direction of arrow a1 by charging of the rechargeable battery 3 through the parasitic diode of the switching element 1A and the switching element 1B in the on-state.

Next, the protecting operation of the control circuit 2 through the input terminal 2e is described.

The control circuit 2 detects overcurrent at the time of charging from the potential between the input terminal 2d and the negative terminal 6b through the input terminal 2e. Then, the control circuit 2 stops the current flowing to the control terminal 2b. Thus, the switching element 1B is turned off, and no current flows from the switching element 1A to the switching element 1B. That is, the current flowing in the semiconductor device 1 depends on the resistance and parasitic diode (reverse direction) of the switching element 1A. Discharging can be performed from the state of detecting overcurrent at the time of charging because the parasitic diode is in the forward direction.

In the case of detecting overcurrent at the time of charging, the potential (voltage) between the input terminal 2d and the negative terminal 6b is less than or equal to a prescribed voltage. Thus, the switching element 1A and the switching element 1B are turned on and off, respectively.

The control circuit 2 detects overcurrent at the time of discharging from the potential between the input terminal 2d and the negative terminal 6b through the input terminal 2e. Then, the control circuit 2 stops the current flowing to the control terminal 2a. Thus, the switching element 1A is turned off, and no current flows from the switching element 1B to the switching element 1A. That is, the current flowing in the semiconductor device 1 depends on the resistance and parasitic diode (reverse direction) of the switching element 1B. Charging can be performed from the state of detecting overcurrent at the time of discharging because the parasitic diode is in the forward direction.

In the case of detecting overcurrent at the time of discharging, the potential (voltage) between the input terminal 2d and the negative terminal 6b is more than or equal to a prescribed voltage. Thus, the switching element 1A and the switching element 1B are turned off and on, respectively.

When the power supply 6 is a charger of 0 V, the control circuit 2 fixes the control terminal 2b at a constant potential. Then, the switching element 1B is turned on, and the charging operation is started.

As described above, the semiconductor device 1 is connected in series with the rechargeable battery 3. By the control circuit 2, one of the switching elements 1A, 1B of the semiconductor device 1 is turned on, and the other is turned off. This suppresses overcharge and overdischarge of the rechargeable battery 3.

Next, the effect of this embodiment is described.

Figure 4:
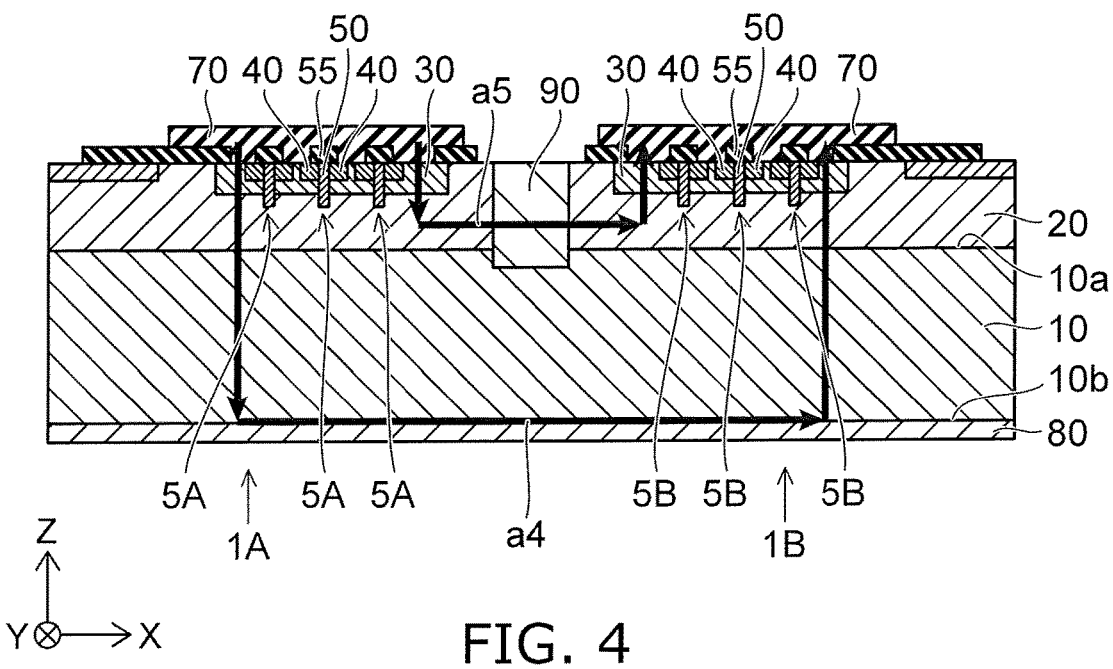
FIG. 4 is a sectional view showing the current path of the semiconductor device according to the embodiment.

FIG. 4 is a sectional view showing the current path of the semiconductor device according to the embodiment.

The region shown in FIG. 4 corresponds to the region shown in FIG. 2.

In this embodiment, the semiconductor device 1 includes a conductor 90 provided in the semiconductor layer 10 and the semiconductor layer 20 and located between the switching element 1A and the switching element 1B in the X-direction.

The conductor 90 thus provided lowers the resistance value between the switching element 1A and the switching element 1B and allows a current to flow easily in the semiconductor device 1. This improves the electrical characteristics of the semiconductor device 1.

Here, as shown in FIG. 4, in the semiconductor device 1 composed of two switching elements 1A, 1B, the drain electrode 80 is provided as a common electrode. For instance, when the current flows from the switching element 1A to the switching element 1B, the current first flows from the source electrode 70 of the switching element 1A through the element part 5A to the semiconductor layer 20 and the semiconductor layer 10. Subsequently, the current flows from the semiconductor layer 10 to the drain electrode 80. Then, the current flows from the semiconductor layer 10 and the semiconductor layer 20 through the element part 5B to the source electrode 70 of the switching element 1B. That is, the current may flow like arrow a4 of FIG. 4.

When only the current path like arrow a4 of FIG. 4 is formed, the current path is lengthened. Furthermore, the current path of arrow a4 includes the semiconductor layer 20. The semiconductor layer 20 contains silicon, and its conductivity type is $n^-$-type. Thus, the semiconductor layer 20 is likely to have high resistivity. This makes the resistance value higher in the current path of arrow a4.

It may be considered that the resistance value is decreased by e.g. decreasing the Z-direction thickness of the semiconductor layer 20 to make the current path shorter. However, decreasing the Z-direction thickness of the semiconductor layer 20 may affect the electrical characteristics of the semiconductor device 1, e.g. the potential difference between the source electrodes 70 of the switching elements 1A, 1B. This may cause malfunctions of the semiconductor device 1.

In the semiconductor device 1 of this embodiment, the conductor 90 is provided in the semiconductor layer 10 and the semiconductor layer 20 and located between the switching element 1A and the switching element 1B in the X-direction. In the presence of such a conductor 90, when the current flows from the switching element 1A to the switching element 1B, the current first flows from the source electrode 70 of the switching element 1A through the element part 5A to the semiconductor layer 20. Subsequently, the current flows from the semiconductor layer 20 to the conductor 90. Then, the current flows from the semiconductor layer 20 through the element part 5B to the source electrode 70 of the switching element 1B.

That is, besides the current path of arrow a4 of FIG. 4, the current flows like arrow a5 of FIG. 4. Thus, the conductor 90 having lower resistivity than the semiconductor layer 20 is provided in the semiconductor layer 20. This lowers the resistance value between the switching element 1A and the switching element 1B and allows a current to flow easily from the switching element 1A to the switching element 1B.

This embodiment can provide a semiconductor device and a control system having improved electrical characteristics.

As described above, as an example, the foregoing describes the case where the first conductivity type is n-type and the second conductivity type is p-type. However, the first conductivity type may be p-type, and the second conductivity type may be n-type. In this case, the semiconductor device 1 is formed by inverting the conductivity type of each semiconductor layer described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   a first semiconductor layer of a first conductivity type;
   a first switching element including:
      a plurality of first element parts provided on the first semiconductor layer, each of the first element parts including a first control electrode; and
      a first electrode provided on the first element parts;
   a second switching element juxtaposed in a first direction with the first switching element and including:
      a plurality of second element parts provided on the first semiconductor layer, each of the second element parts including a second control electrode; and
      a second electrode provided on the second element parts; and
   a conductor provided at least in part on the first semiconductor layer and located between the first switching element and the second switching element in the first direction,
   wherein a distance between a first point of location on the first electrode and a bottom surface of the conductor being longer than a distance between the first point of location on the first electrode and a bottom surface of the first control electrode in a vertical direction perpendicular to the first direction, and
   wherein a distance between a second point of location on the second electrode and the bottom surface of the conductor being longer than a distance between the second point of location on the second electrode and a bottom surface of the second control electrode in the vertical direction; and
   a second semiconductor layer having a first surface on which the first semiconductor layer is located and a second surface on an opposite side from the first surface, wherein the bottom surface of the conductor extends past the first surface of the second semiconductor layer,
   wherein the conductor is in electrical contact with both the first semiconductor layer and the second semiconductor layer, and the bottom surface of the conductor is in direct contact with the second semiconductor layer.

2. The device according to claim 1, wherein the conductor contains a metal material.

3. The device according to claim 1, wherein the conductor is selected from the group consisting of tungsten, nickel, aluminum, titanium, molybdenum, copper, gold, and platinum.

4. The device according to claim 1, wherein
   the conductor and the first semiconductor layer are silicon layers including an impurity of the first conductivity type,
   a conductivity type of the conductor is the first conductivity type, and
   an impurity concentration of the conductor is higher than an impurity concentration of the first semiconductor layer.

5. The device according to claim 1, wherein
   the second semiconductor layer is of the first conductivity type,
   a bottom surface of the conductor reaches the second semiconductor layer, and
   the first semiconductor layer and the second semiconductor layer are located on a side surface in the first direction of the conductor.

6. The device according to claim 5, wherein the conductor extends in a second direction parallel to the first surface of the second semiconductor layer and crossing the first direction.

7. The device according to claim 1, wherein
   a bottom surface of the conductor is located on the first semiconductor layer, and
   the first semiconductor layer is located on a side surface in the first direction of the conductor.

8. The device according to claim 1, further comprising:
   a third semiconductor layer of a second conductivity type provided on the first semiconductor layer and surrounding the first control electrodes of the first element parts; and
   a fourth semiconductor layer of the second conductivity type provided on the first semiconductor layer and surrounding the second control electrodes of the second element parts.

9. The device according to claim 1, further comprising:
   a third electrode provided on the second surface of the second semiconductor layer.

10. The device according to claim 9, wherein
    a bottom surface of the conductor reaches the third electrode, and
    the first semiconductor layer and the second semiconductor layer are located on a side surface in the first direction of the conductor.

11. The device according to claim 9, wherein
    the first electrode and the second electrode are source electrodes, and
    the third electrode is a drain electrode.

12. The device according to claim 1, wherein
the first point is located on a bottom surface of the first electrode, and
the second point is located on a bottom surface of the second electrode.

13. The device according to claim 1, further comprising:
a third electrode provided on the second surface of the second semiconductor layer, wherein
a distance between the bottom surface of the conductor and an upper surface of the third electrode being shorter than a distance between the bottom surface of the first control electrode and the upper surface of the third electrode in the vertical direction, and
a distance between the bottom surface of the conductor and the upper surface of the third electrode being shorter than a distance between the bottom surface of the second control electrode and the upper surface of the third electrode in the vertical direction.

14. The device according to claim 8, wherein the second semiconductor layer and the third semiconductor layer are located between the first control electrode and the conductor in the first direction.

15. The device according to claim 1, wherein the conductor is in direct contact with both the first semiconductor layer and the second semiconductor layer.

* * * * *